(12) United States Patent
Gibson et al.

(10) Patent No.: US 9,562,283 B2
(45) Date of Patent: Feb. 7, 2017

(54) COATING OF OPTICAL SUBSTRATES USING CLOSED FIELD SYSTEM

(75) Inventors: Desmond Gibson, Coalville (GB); John Michael Walls, Coalville (GB)

(73) Assignee: Applied Multilayers LLC, Battle Ground, WA (US)

( * ) Notice: Subject to any disclaimer, the term of this patent is extended or adjusted under 35 U.S.C. 154(b) by 1517 days.

(21) Appl. No.: 11/575,953

(22) PCT Filed: Sep. 26, 2005

(86) PCT No.: PCT/GB2005/003707
§ 371 (c)(1),
(2), (4) Date: Dec. 13, 2007

(87) PCT Pub. No.: WO2006/032925
PCT Pub. Date: Mar. 30, 2006

(65) Prior Publication Data
US 2008/0223715 A1    Sep. 18, 2008

(30) Foreign Application Priority Data

Sep. 25, 2004  (GB) .................................. 0421389.8

(51) Int. Cl.
*C23C 14/00* (2006.01)
*C23C 14/35* (2006.01)
(Continued)

(52) U.S. Cl.
CPC ........... *C23C 14/54* (2013.01); *C23C 14/0078* (2013.01); *C23C 14/06* (2013.01); *C23C 14/0682* (2013.01);
(Continued)

(58) Field of Classification Search
CPC ............... C23C 14/0078; C23C 14/00945; C23C 14/0641; C23C 14/08; C23C 14/352; C23C 14/505; C23C 14/0094; C23C 14/54; C23C 14/10; C23C 14/06; C23C 14/0682; C23C 14/082; C23C 14/0036; H01J 37/3405
(Continued)

(56) References Cited

U.S. PATENT DOCUMENTS 6,217,720 B1 *  4/2001  Sullivan et al. ......... 204/192.13
6,365,010 B1    4/2002  Hollars
(Continued)

FOREIGN PATENT DOCUMENTS

WO          2004/029324 A1    4/2004

*Primary Examiner* — Michael Band
(74) *Attorney, Agent, or Firm* — LeClairRyan, a Professional Corporation

(57) ABSTRACT

The invention relates to apparatus and a method for depositing material onto substrates, particularly optical substrates, to form a coating thereon. The apparatus and method incorporates the use of a series of magnetrons provided to be controlled to sputter deposit material provided in targets mounted therein, on to the substrates. There is provided a voltage to the magnetrons to operate the same and the level of voltage which is required to form required coating or coating layer characteristics is determined by using monitoring apparatus, at least when forming the coating or coating layer for the first time. The appropriate voltage level data for operation of the magnetrons can be held in a database and subsequently used to control the voltage level when forming an identified coating or layers of coatings.

16 Claims, 4 Drawing Sheets

(51) Int. Cl.
*C23C 14/50* (2006.01)
*C23C 14/10* (2006.01)
*C23C 14/06* (2006.01)
*C23C 14/54* (2006.01)
*C23C 14/08* (2006.01)
*H01J 37/34* (2006.01)

(52) U.S. Cl.
CPC ............ *C23C 14/082* (2013.01); *C23C 14/10* (2013.01); *C23C 14/352* (2013.01); *C23C 14/505* (2013.01); *H01J 37/3405* (2013.01); *C23C 14/0036* (2013.01)

(58) Field of Classification Search
USPC .......................... 204/192.13, 192.15, 192.26
See application file for complete search history.

(56) References Cited

U.S. PATENT DOCUMENTS

| | | | |
|---|---|---|---|
| 6,537,428 B1 * | 3/2003 | Xiong et al. ............. | 204/192.13 |
| 2004/0026240 A1 | 2/2004 | Shidoji et al. | |

* cited by examiner

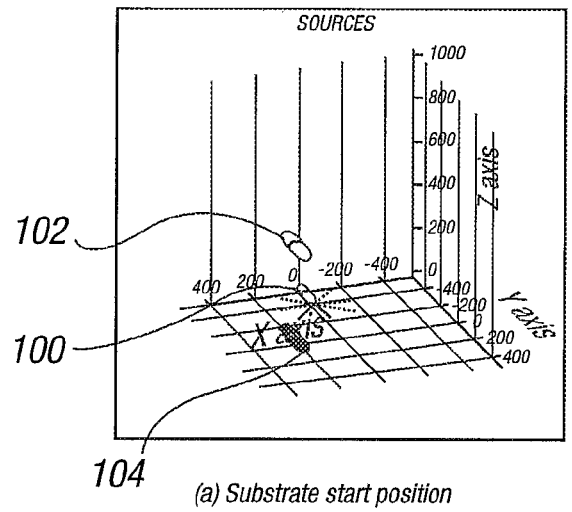
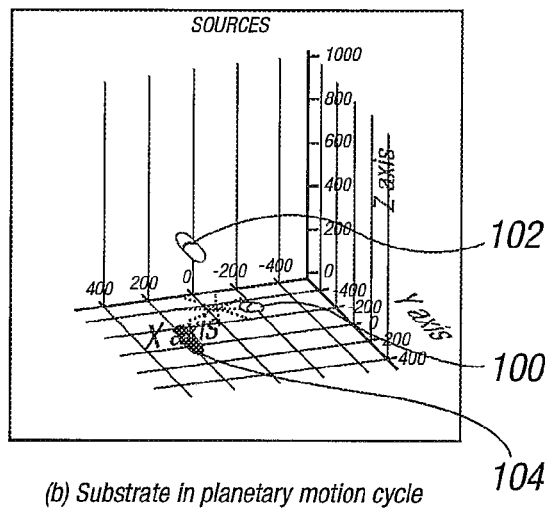
(a) Substrate start position    (b) Substrate in planetary motion cycle
FIG. 3A    FIG. 3B
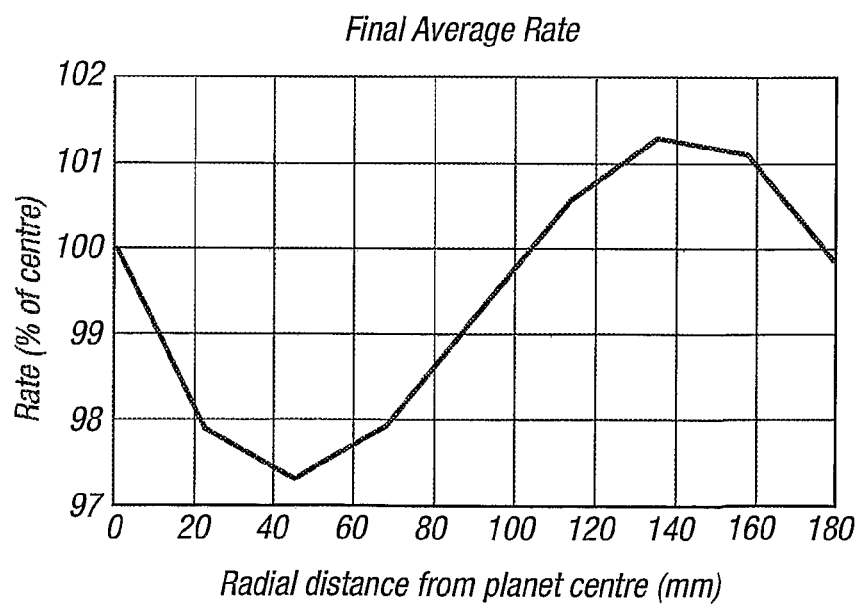
FIG. 4

COATING OF OPTICAL SUBSTRATES USING CLOSED FIELD SYSTEM

This application is a national stage application under 35 U.S.C. §371 from PCT Application No. PCT/GB2005/003707, filed Sep. 26, 2005, which claims the priority benefit of Great Britain Application No. 0421389.8, filed Sep. 25, 2004.

The invention to which this application relates is to a method and apparatus for the application of material, by sputter deposition, onto one or a series of substrates so as to form a single or multilayered coating thereon. The coating which is applied can provide any or any combination of particular features to the substrates such as for example reflective or anti-reflective properties; infra red blocking properties or the like. In particular, the method and apparatus is of benefit for use in the application of coatings to optical substrates or substrates for optical purposes such as, for example, ophthalmic lenses, reflectors or the like, with the substrate being of any suitable material such as, in the case of reflectors, metal, and for lenses, of plastic or glass.

The applicant, in their co-pending patent application PCT/GB2003/04189 discloses an apparatus and method which utilises a coating system known from the patent GB2258343.

The aim of the present invention is to provide further improvements which allow the utilisation of the deposition apparatus in a manner which is specifically suited to the application of coatings to an optical substrate and in a manner which provides particular benefits.

In a first aspect of the invention there is provided apparatus for the application of material from targets of unbalanced magnetrons, said magnetrons mounted in a deposition chamber and in or through which at least one substrate to be coated is moved so as to allow the material deposited by selective sputtering from the targets of the magnetrons to be deposited thereon and during the application of the coating, the magnetrons which are not being used to deposit material onto the substrates are held in either an off condition or are located behind a shutter so as to prevent or reduce oxidation of the target material of those magnetrons when not being used to deposit material wherein said apparatus includes monitoring apparatus to allow the determination of a particular voltage level which is required to be supplied to each of the magnetrons to allow the effective deposition of material from the target of each magnetron when the magnetron is being operated to deposit material onto the at least one substrate.

In one embodiment one or more of the magnetrons may be held at operating power behind a shutter so that there is no uncertainty in deposition rate even for the first few layers.

In one embodiment the reaction occurs at the magnetron target surface and all the way round the drum such that the target surface is poisoned in a controlled way. The degree of metal oxidation is pre-determined to ensure that the deposited material is fully oxidised and stoichiometric. The control is provided by optical emission monitoring or by controlling the target voltage at a particular point on the hysteresis curve. As the target is operated in a partially poisoned state pulsed dc or ac power is preferably used to avoid arcing and process instability. Preferably the power supply is used in "constant power" mode so that the deposition rate remains constant and coating thickness is proportional to time.

As a result time is used to control thickness although quartz crystal monitoring or direct optical monitoring for more demanding applications can still be used as required.

Typically, if the material of the target is a relatively highly reactive material the magnetron will be moved to a low power condition rather than an off condition so as to reduce the time required to move the magnetron to full power to a usable condition for sputtering when the material of this target is next required to be deposited. If the material of the target of the magnetron is a relatively non-reactive material then the magnetron will preferably be moved to an off condition as the time required to move that magnetron and target to an operating condition is sufficiently short so as to not be a factor in the operation of the apparatus and the overall time taken for the coating to be applied.

If the magnetron is off the target will be electrically floating and not earthed.

In one embodiment, the substrates are held on a holder which is movable within the deposition chamber. Typically, the substrate and/or holder are held at floating potential. In an alternative embodiment the substrate is moved as a unit in the deposition chamber.

The use of the floating potential is found to work extremely well for insulating metal oxide layers. We believe the resulting energy of deposition is in the range 20-50 eV which is close to ideal for good coating structure. This attractive energy condition is combined with high levels of ionisation (current density).

Typically plasma cleaning of the surface of the substrate is used as the first process step, where a bias is applied to the substrate surface to accelerate argon or argon/oxygen ions to the surface. The surface may also be biased if depositing metal layers.

Typically the apparatus further includes a shield or shutter which is selectively movable with respect to the substrate and magnetrons within the deposition chamber so as to allow the selective exposure of the targets of the unbalanced magnetron to the substrate to suit particular operating conditions and thereby allow the selective deposition of material from the target onto the substrate held on the holder.

For certain applications it may not be necessary to include shutters

The shield or shutter arrangement can be provided as a single layer or, alternatively, second, third or more shutters or shields are provided and selectively movable with respect to each other and the magnetron and substrate holder. If the shield or shutters are provided then the same is/are preferably held at a floating potential.

In one embodiment the voltage to the magnetron or magnetrons which are being used to apply material is held at a constant value. Typically said value is predetermined with respect to the material of the target, and/or the density of the material required on the substrate and/or the depth of the material required on the substrate and/or the spacing of the target from the substrate. In any case, the holding of the voltage at a constant level allows the control of the application of the layer of the material within required predetermined tolerances.

Typically the voltage on the target is a measure of degree of poisoning (oxidation). Because of hysteresis there may be two different target oxidation conditions for the same voltage depending on whether the voltage is approached from the metal state or the fully oxidised state. It is important that the correct position is located and maintained by controlling the gas flow through a mass flow controller to maintain the voltage constant. Alternatively, optical emission monitoring and gas flow control through a piezoelectric valve can be used to do the same job, but it is less responsive.

In one embodiment, the apparatus further includes an optical emission monitor and/or a piezo crystal monitor so as to allow the application of the material onto the substrate to be monitored as the coating is formed. In one embodiment the monitoring apparatus can be used during normal usage of the apparatus. Alternatively the monitoring apparatus can be used to allow the determination of a particular voltage level which is required to be supplied for the effective deposition of a particular material from a particular target. Once this voltage level has been determined through trials, the monitoring means may no longer be required to be used and the ongoing control of the voltage can be sufficient to provide the control of the application of the material to form a coating layer as required.

In one embodiment of the invention there is provided apparatus for depositing sputter material to form a coating on a substrate, said apparatus including at least one magnetron in a deposition chamber, said magnetron selectively operable to deposit material from a target provided therewith and said magnetron configured with other magnetrons and/or magnets to form a closed field to provide high current density and low ion energy wherein the apparatus includes means for positioning the substrate to be coated in front of said magnetron and providing relative movement between the substrate and magnetron to allow the substrate external surface to be coated.

In one embodiment the substrate is rotated about its own axis. In an additional embodiment the substrate is rotated with a planetary motion.

In one embodiment the closed field configuration includes a magnetron to a first side of the substrate, said magnetron having a target of material to be deposited therefrom on to the substrate and to the opposite side of the substrate there is provided at least one magnet arranged such that the closed field is formed between the magnetron and magnets and in which the substrate to be coated is positioned In one embodiment, the apparatus further includes baffling means, said baffling means located intermediate the magnetrons provided in the deposition chamber.

In one embodiment, the baffling means protrudes from the walls of the deposition chamber inwardly towards the shield or shutter. Preferably, further baffling means are provided to the top and bottom of the deposition chamber.

Preferably the baffling means are mounted so as to have a floating potential.

In whichever embodiment, the unbalanced magnetrons are located and provided and configured so as to provide a closed field. In one arrangement, additional magnets are located in the deposition chamber to further enhance the closed field effect and said additional magnets act to encourage the creation of the closed field and the sputtering of material onto the substrate.

In one embodiment the apparatus includes a database in which data relating to at least one voltage level to be used with regard to at least one magnetron when operated to deposit material to form a specified coating or coating layer, is held, said data having previously been determined using the same monitoring apparatus. Typically the apparatus can be controlled to operate at the voltage levels determined by data held in the database when identified coatings or coating layers are to be formed.

In a further aspect of the invention there is provided a method for the application of one or a number of layers of material onto at least one substrate to form a coating thereon, said substrate being of an optical type, said method comprising the steps of placing the substrates to be coated onto a holder, placing said holder so as to be moved within a deposition chamber, providing control means for at least first and second unbalanced magnetrons mounted within the deposition chamber, moving said substrate holder within said deposition chamber and selectively operating said magnetrons within the chamber to deposit material from a target associated with each of said magnetrons onto the substrate so as to form a coating of the required type, said unbalanced magnetrons arranged in a closed field configuration and wherein a monitoring step is performed for a coating or at least one of the coating layers to allow the determination of the particular voltage level which is required to be supplied to each magnetron to achieve the required control of deposition of material from the magnetron within the deposition chamber and, during the subsequent operation of said magnetrons when sputter depositing material onto the substrate, to form said coating or at least one coating layer, they are operated with the said voltage level which has been determined for each of said magnetrons.

Typically the monitoring step is performed for each new coating or coating layer to be formed and the voltage levels for each magnetron are stored in a database with reference to said coating or coating layer to allow those voltage levels to be subsequently used for the formation for the identified coating or coating layer without the need for the monitoring step to be repeated when said coating or coating layer is to be formed.

Typically at least one gas is supplied into the deposition chamber to allow reactive sputtering to be performed.

Typically when the magnetron is not being used to deposit material onto the substrate, a shutter is positioned in front of the magnetron so that any sputtered material cannot reach the substrate.

Preferably when a magnetron is not being used to deposit material onto the substrate the voltage to the magnetron is turned off to move the same to an off condition so that no material is sputtered therefrom.

Typically the method includes initially monitoring the application of material from each magnetron onto the substrate to form a coating of the sputtered material of a required form and on the basis of the monitored data, once the required coating parameters are achieved, the voltage used to create that coating is identified as the voltage level to be set for subsequent operation for the application of the particular coating.

Typically the voltage level to be applied for each material coating layer is determined with respect to the degree of target oxidation in operation. The step of monitoring the application of the coating material is withdrawn once a predetermined voltage level for operation of each of the magnetrons to deposit the material layers on the substrate has been determined.

Typically the monitoring step is performed at the start of the application of a new coating and thereafter repeated after periods of time of operation of the apparatus. The monitoring can be performed under factory conditions initially and the determined voltage levels supplied in instructions provided to subsequent users of the method.

Typically each of the magnetrons has a predetermined voltage level supplied thereto so as to allow control of the operating condition of that magnetron when the same is being operated to deposit material. Each of the magnetrons can have differing predetermined voltage levels provided for the application of different coating layers to allow variation in the material structure in each layer.

When used in reactive sputtering mode the process requires a supply of gas such as oxygen, nitrogen.

Typically the optimisation of each material coating is obtained by monitoring the coating to determine what voltage level allows a degree of target poisoning (oxidation)

which results in a fully oxidised deposited material with the correct stoichiometry and required optical properties (refractive index, absorption etc.).

In one embodiment the monitoring includes the monitoring of optical emission intensity.

Subsequent processes are then carried out at the same voltage setting or optical emission intensity.

In one embodiment each of the magnetrons can have differing operating voltage levels for the deposition of material therefrom for different coating layers to allow variation in the material structure in each layer.

In one embodiment when the magnetron power supply is off the target is electrically floating and not earthed. Typically the substrates and holder for the same within the deposition chamber are held at floating potential.

In one embodiment a plurality of magnetrons are provided and the same can be selectively operated to provide a coating of mixed materials deposited from said operating magnetrons.

Typically one or more magnetrons are operated to deposit material in the presence of one or more than one reactive gases which is/are introduced into the deposition chamber.

Typically the magnetrons are operated to deposit metal in the presence of a reactive gas introduced into the deposition chamber or can be operated in the absence of a reactive gas to deposit a pure metal coating or layer of a coating.

Specific embodiments of the invention will now be described with reference to the accompanying drawings, wherein.

Figure 5:
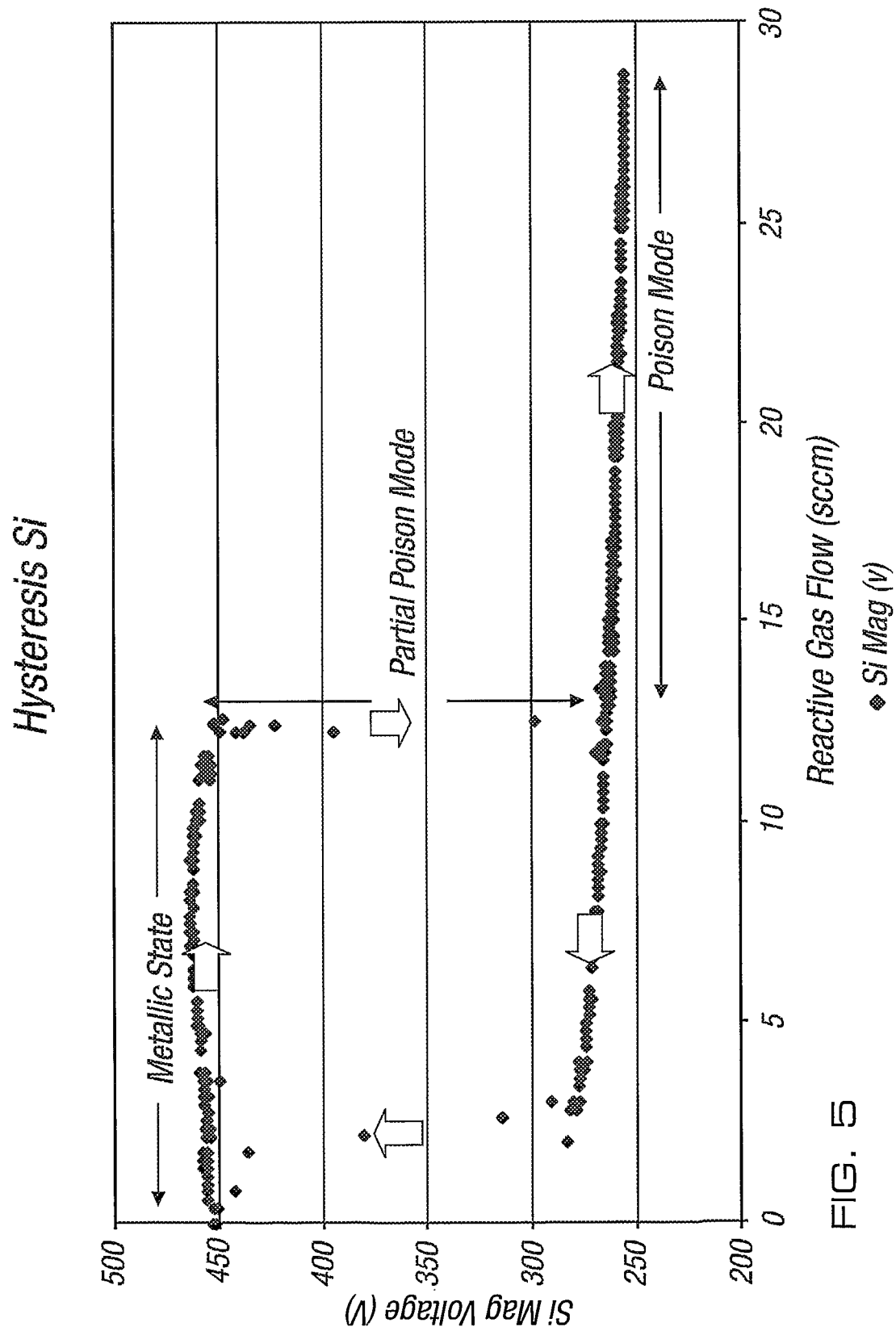
Figure 6:
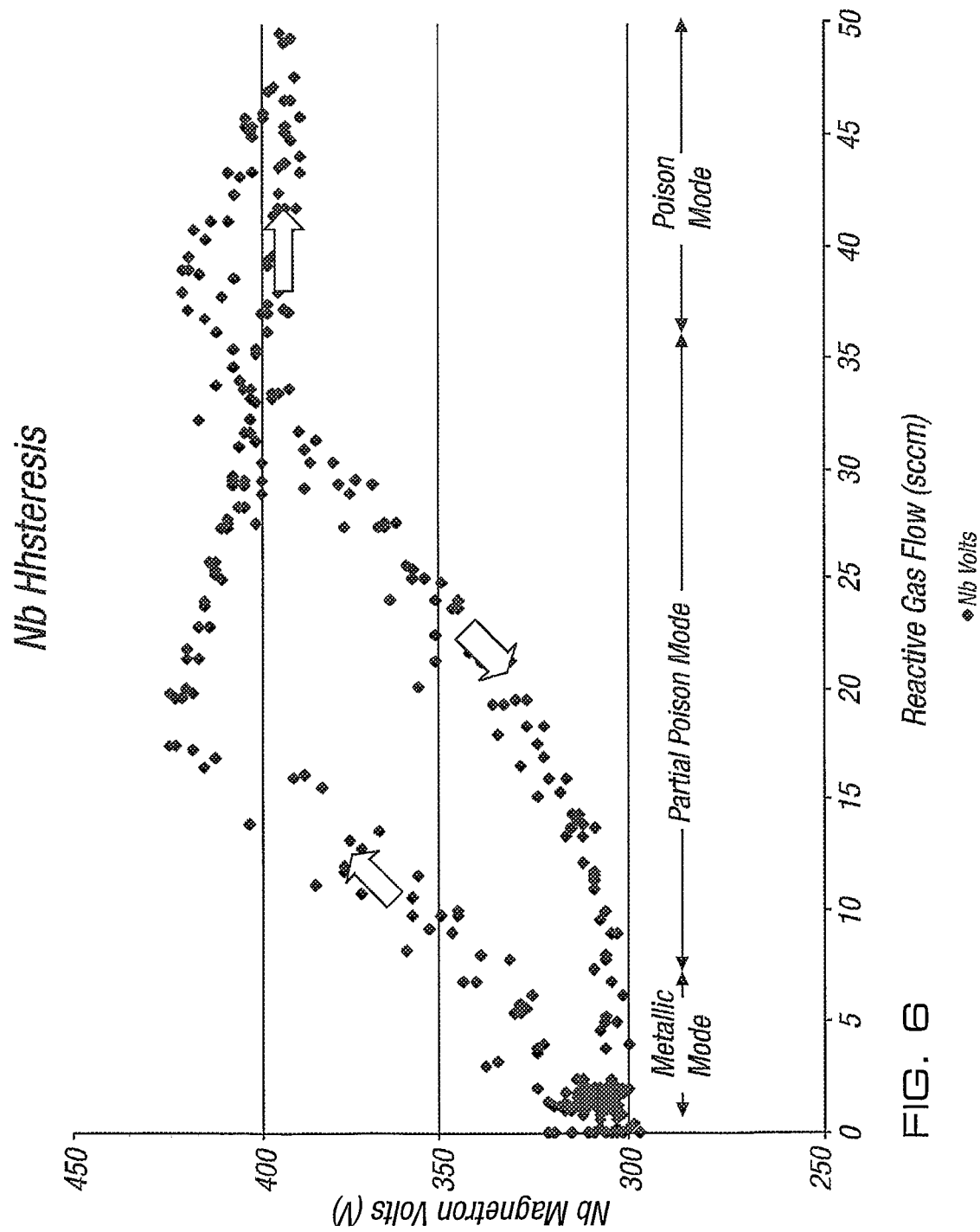

FIGS. 3a and b illustrate a further embodiment of the invention;

FIG. 4 illustrates the results obtained in accordance with the embodiments of FIGS. 3a and b in one example of use; and FIGS. 5 and 6 illustrate the hysteresis curves for the application of two target materials.

Figure 1:
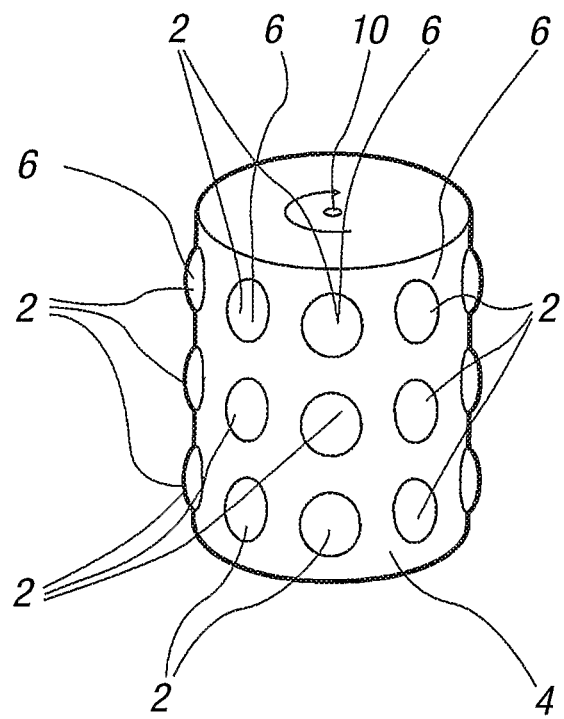
FIG. 1 illustrates a substrate holder in accordance with one embodiment of the invention.

Referring firstly to FIG. 1, there is illustrated a substrate holder arrangement which can be used in accordance with the invention to support a series of substrates 2, on the holder 4.

Figure 2:
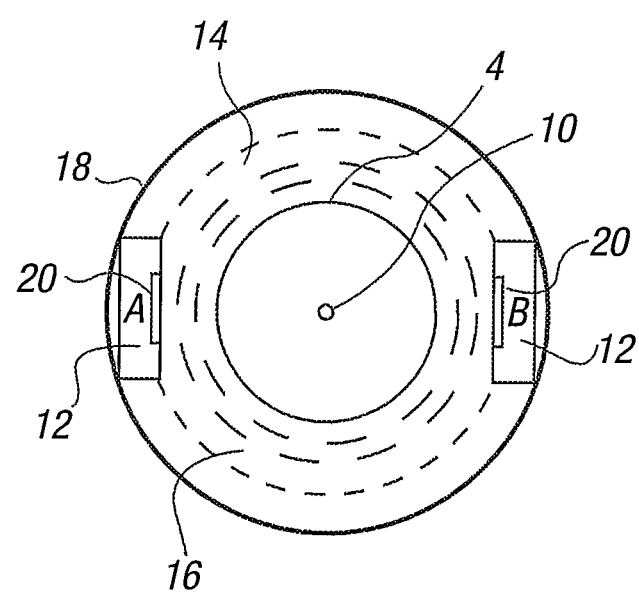
FIG. 2 illustrates, schematically, apparatus in accordance with one embodiment of the invention.

It will be seen that the substrates are provided in rows 6 on the holder and that the holder is provided for rotation around the longitudinal axis 10. A preferred speed of rotation, although this can be adapted, is 50 rpm. The holder is provided within a deposition chamber, and at the walls of the same are provided a series of unbalanced magnetrons 12 as shown in FIG. 2. The holder is electrically isolated at the top and bottom and typically sits on a ferrofluidic drive means which allows coupling for drive through the vacuum created in the deposition chamber 14. The holder is provided at floating potential in operation.

As illustrated in FIG. 2, the magnetrons 12 are provided such that opposite pairs A, B are of opposing magnetic polarity and as a result, the closed field configuration as described in the co-pending application and patent as described previously is created. No ion source is necessary as the magnetic track generated by the closed field allows the electrons to move around the same as indicated by the area 16 and so there is no need for separate reaction and deposition zones as the electrons are discouraged from passing the earthed walls 18 of deposition chamber.

For certain reactive requirements, an additional ion or plasma or microwave source may be used to further enhance the reactive conditions Each of the magnetrons 12 is provided with a target 20 of a material which is required to be deposited onto the substrates 2. When the material is not required to be deposited from a magnetron, preferably no power is supplied so that the same is switched off. However, alternatively the magnetron can be operated at a relatively low power supply or at full power and positioned behind a shutter to prevent the deposited material from reaching the substrates.

If the material of the target is relatively reactive then a low power supply may be provided in order that the start-up time once the material is to be deposited is not so great so as to delay the coating process. If the material is not particularly reactive then the power supply can be shut off as the start-up time for this type of material is not particularly long.

In addition to determining whether or not the material is deposited from a particular magnetron, the level of voltage of the power supply to the magnetron is used to control and determine the particular coating characteristics which are to be obtained for the layer of the material which is deposited. This is useful as it means that if the appropriate voltage level is predetermined, then the parameters of the coatings which are achieved are repeatable and hence no or a reduced level of testing needs to take place on coatings which are formed each time.

In one embodiment, when a target material is to be deposited onto a substrate for a coating for the first time, appropriate monitoring apparatus can be used either as part of the apparatus or in separate "trial" apparatus so as to monitor the application of the material. During these trials, once the material is found to be applied onto the substrate in the required form then the voltage level to the magnetron, which has allowed that coating to be achieved, is noted. Thus, in subsequent uses, the same voltage level can be supplied to the magnetron and the user can be confident that as long as the voltage supply is kept at the required level, then the appropriate coating characteristics will be achieved. As a result the user of the apparatus may when using the apparatus be provided with a reference table which sets out required voltage levels for specific material coating layers.

Typically the deposition conditions are stored in the system computer.

Normally, each of the magnetrons is operable independently so as to allow the level of control of the material coating application to be adhered.

In one embodiment magnetrons can be run simultaneously as can the gases introduced to form alloys or other combined coatings.

Thus, in accordance with the invention, there is provided a means whereby a particular method of application can be achieved with consistency. As an example, in the application of a coating onto ophthalmic plastic lens, the following steps can be used, where the material targets are silicon magnetron 12A and niobium in magnetron 12B.

1) Place substrates into the deposition chamber 14 and onto the holder; close the chamber door and pull a vacuum 2) apply argon gas into the deposition chamber 14 to clean the substrate surfaces;

3) apply silicon material from a target 20 of one of the magnetrons 12 to apply a bonding layer onto the substrates;

4) Admit oxygen gas and maintain a predetermined voltage on the target 5) selectively extend the power supply to operate magnetrons 12A and B in the deposition chamber 14 to apply silicon layers of niobium, silica, niobium and silica;

6) if required, in order to provide a hydrophobic coating then a thermal evaporation or plasma CVD process.

Referring now to FIGS. 3a and b, there is illustrated an alternative embodiment whereby a substrate to be coated is of a relatively large area and could for example be a flat panel screen display. In contrast to the conventional use of a drum shaped holder, in this embodiment, the substrate 100 is held in front of a closed field magnetron 102 thereby enhancing the deposition rate by typically a factor of 8. The substrate 100 is then rotated either about its own axis or is rotated in a planetary motion as illustrated about an axis to achieve uniform thickness of application onto the surface of the substrate of a coating to a level of typically plus or minus 1-2%. In order to obtain the closed field configuration, a series of additional magnets 104 which are electrically floating, are positioned apparatus the material deposition magnetron 102 and to the reverse side of the coated substrate 100. FIGS. 3a and b show a particular polarity motion scheme for a large circular substrate 100 which is rotated about two axes. FIG. 3a shows the substrate in a starting position and FIG. 3b shows the substrate during the planetary motion cycle. It also shows how the additional magnets are provided opposite to the magnetron and at the reverse of the substrate to provide the closed magnetic field.

A similar geometry could also be used in an "in-line coating system"

FIG. 4 illustrates a calculated relative deposition rate along the substrate radius which indicates a uniformity of plus or minus 2% over the full area of the substrate which is coated in accordance with FIGS. 3a and b. The additional magnets behind the substrate ensures the magnetic field closure with the deposition magnetron and the additional magnet can be either stationary or located to move with the substrate to provide enhanced time averaging of the ion current density and also to ensure ion current density and closure is maximised at the substrate plane. The embodiments of FIGS. 3a, b and 4 can be utilised with circular or annular magnetrons in which case the additional magnets would be stationary or have a motion in accordance with the motion of the substrate.

In any of the examples given and indeed in combination with the features of the invention as herein described, the substrates to be coated can be moved into and out of the coating chamber using a loading system whereby the coating chamber is retained in vacuum. This is achieved by providing an additional loading chamber which can also be moved to a vacuum condition selectively. As a result, to load the substrates, the same are mounted on a carrier and moved into the loading chamber in atmospheric pressure or the carrier may already be in the loading chamber. When loaded, the loading chamber is closed and a vacuum created in the loading chamber. A port between the loading chamber and the coating chamber is opened and the carrier with substrates is moved into the coating chamber in vacuum.

To unload the substrates the reverse order of steps can be followed so that vacuum can always be maintained in the coating chamber and hence the condition of the magnetron targets maintained.

An important feature of reactive sputtering processes is the highly non-linear process characterised by hysteresis behaviour. The key to understanding and controlling the reactive sputtering process is in its hysteresis curve, unique to each material used to coat the substrates and the deposition system used.

The hysteresis curves (in this case characterised using magnetron voltage variations as a function of reactive gas flow) for two routinely used materials in optical coatings (silica [$SiO_2$] and niobia [$Nb_2O_5$]) are shown in FIGS. 5 and 6 for this closed field magnetrons sputter system.

Typically, each material starts with the target in a metallic mode and a corresponding voltage, typically 500V and 320V for silica and niobia respectively. The magnetron voltage is a sensitive measure of the magnetron surface reaction as a consequence of related sensitivity to the secondary electron emission coefficients from the surface, which is in turn sensitive to the surface conditions.

As shown in FIGS. 5 and 6, initial gas flow increase provides no significant change in voltage. This is a consequence of the reactive gas being consumed (gettered) by the sputtered material with minimal influence on the target surface. However, when the reactive gas flow exceeds the gettering rate of the sputtered metal, the reactive gas then reacts with the target surface to form a layer of the reactive gas metal compound on the surface with a consequential change in target surface condition and hence voltage (normally termed partial poisoned mode) as shown in FIGS. 5 and 6.

Moreover, sputtering rates from the reaction layer on the target surface are less than that of pure metallic targets by a factor of typically 10 to 50. Consequently, less metal atoms are sputtered and less reactive gas is consumed and the target surface undergoes further reaction until the complete target surface is reacted (normally termed fully poisoned mode).

The specific shape of the hysteresis curve is determined by various parameters including gas pumping speed (including influence of thin film pumping (gettering), pressure in the coating chamber, chamber size, substrate magnetron distance, gas distribution scheme, and any other or combination of parameters.

FIGS. 5 and 6 also illustrate that for oxides the hysteresis curves tend to be broad, indicating that once the target is poisoned, the reactive gas flow has to be reduced significantly before the target is sufficiently cleaned to return to metallic state.

For the case of optical coating deposition the requirement is to achieve high deposition rate with acceptable absorption coefficient as dictated by specific application. This normally implies operating the deposition process between metallic and fully poisoned mode. This control should be changeable to allow trade off between absorption coefficient and deposition rate for various applications.

Since the range of control is narrow to achieve high deposition rate, low absorption coefficient and deposition rate stability for optical multilayer coatings, it is necessary to precisely control the operating point on the hysteresis curve.

The technique developed for the closed field magnetron process is to operate the magnetron power supply in constant power mode in conjunction with maintaining magnetron voltage value, and hence operating point on the hysteresis curve, via feedback control of the reactive gas flow.

The magnetron voltage is used to supply an electrical signal to the process controller to control reactive gas flow.

Typically voltage control to <±3V is necessary to achieve optical layer thickness control to <±1%.

A further feature of the invention is the ability to coat both sides of a substrate or substrates. In this arrangement there are provided magnetrons which oppose and face each other and between which the substrate is positioned. The opposing magnetrons have alternate magnet arrangements to create the closed field. Preferably, for uniformity of coating the substrate can be rotated either horizontally or tilted and/or the substrate may be moved using planetary motion movement means. The magnetrons themselves may be circular or linear and are used to deposit material which is the same or may differ on opposing surfaces of the substrate. This allows the coating time to be reduced by a factor of 2 and there is no problem with the application, or backscattering, of material onto other surfaces of the substrate. This arrangement is applicable for small scale or large scale in-line systems.

The present invention therefore provides apparatus and a method which allows unproved coatings to be provided particularly, although not exclusively on substrates for optical coating using closed field coating apparatus.

The invention claimed is:

1. A method for application of one or a number of layers of Si and/or Nb material by reactive sputtering onto at least one optical substrate to form a coating thereon, said method comprising:
    placing said at least one optical substrate to be coated onto a substrate holder;
    placing said substrate holder so as to be rotated within a deposition chamber; providing control for first and second unbalanced magnetrons mounted within the deposition chamber by controlling target voltage;
    introducing a flow of a reactive gas;
    moving said substrate holder within said deposition chamber and selectively operating said first and second unbalanced magnetrons within the chamber to deposit Si and/or Nb material from target material associated with each of said first and second unbalanced magnetrons onto said at least one optical substrate by reactive sputtering so as to form an optical coating, said first and second unbalanced magnetrons being arranged in a closed field configuration;
    a monitoring step comprising monitoring a coating or at least one layer of the coating to allow a determination of a particular hysteresis curve for Si and/or Nb and corresponding target voltage level which is required to be supplied to each magnetron to control deposition of Si and/or Nb material from each magnetron within the deposition chamber, wherein the corresponding target voltage level is between 250V and 475V for Si and about 300V to about 425V for Nb;
    storing in a database a particular target voltage level from the corresponding target voltage level required to control the deposition of material from each magnetron, wherein the particular target voltage level is stored as a stored target voltage level; and
    during a subsequent operation of said first and second unbalanced magnetrons when sputter depositing the same Si and/or Nb material onto an optical substrate, to form said coating or said at least one layer of the coating, said first and second unbalanced magnetrons are operated with said stored target voltage level which has been determined for each magnetron of said first and second unbalanced magnetrons and a control of the reactive gas flow is achieved via feedback of said stored target voltage level obtained with the particular hysteresis curve during the deposition of the Si and/or Nb material,
    wherein each magnetron of said first and second unbalanced magnetrons is operable independently during coating deposition,
    and
    wherein said stored target voltage level stored in the database allows said stored target voltage level to be subsequently used for formation of said coating or said at least one coating layer on an optical substrate without need for said monitoring step to be repeated when said Si and/or Nb material coating or coating layer is to be formed subsequently.

2. A method according to claim 1 wherein the monitoring step is performed for each new Si and/or Nb material coating or coating layer to be formed and the particular target voltage levels for each magnetron are stored in the database with reference to each said new Si and/or Nb material coating or coating layer to allow said stored target voltage levels to be subsequently used for the formation of the new Si and/or Nb material coating or coating layer without the need for the monitoring step to be repeated when said new Si and/or Nb material coating or coating layer is to be formed.

3. A method according to claim 1 wherein when a magnetron is not being used to deposit Si and/or Nb material onto the substrate a shutter is positioned in front of the magnetron so that any sputtered Si and/or Nb material cannot reach the substrate.

4. A method according to claim 1 wherein when a magnetron is not being used to deposit Si and/or Nb material onto the substrate the voltage to the magnetron is turned off.

5. A method according to claim 1 wherein the method includes the monitoring step and comprises initially monitoring the application of Si and/or Nb material from each magnetron onto the substrate to form a particular coating or coating layer of a required form and on the basis of the monitored data, when the required coating parameters are achieved, a voltage used is identified as the particular target voltage level to be stored as the stored target voltage level for subsequent operation for the application of the particular coating or coating layer.

6. A method according to claim 5 wherein the particular target voltage level to be applied for each Si and/or Nb material coating layer is determined with respect to the degree of target oxidation in operation.

7. A method according to claim 1 wherein steps of moving said substrate holder, said selectively operating, and said monitoring are repeated until said storing is carried out, and thereafter the monitoring step is withdrawn.

8. A method according to claim 1 wherein the monitoring step is performed at the start of the application of a new Si and/or Nb material coating or coating layer, and thereafter repeated after periods of time of operation of the deposition chamber.

9. A method according to claim 1 wherein the monitoring step is performed initially under predetermined voltage levels supplied in instructions provided for subsequent use of the method.

10. A method according to claim 1 wherein each of the magnetrons has a predetermined voltage level supplied thereto so as to allow control of the operating condition of that magnetron when operated to deposit Si and/or Nb material.

11. A method according to claim 1 wherein each of the magnetrons has a different predetermined voltage level provided for the application of different coating layers to allow variation in the Si and/or Nb material structure in each coating layer.

12. A method according to claim 1 wherein when the magnetron power supply is off the target is electrically floating and not earthed.

13. A method according to claim 1 wherein the at least one optical substrate and corresponding substrate holder within the deposition chamber are held at floating potential.

14. A method according to claim 1 wherein said first and second unbalanced magnetrons are selectively operated to provide a coating of mixed Si and/or Nb materials on the at least one optical substrate.

15. A method according to claim 1 wherein said first and second unbalanced magnetrons are operated to deposit Si and/or Nb material in the presence of more than one reactive gas introduced into the deposition chamber.

16. A method according to claim 1 wherein said monitoring the coating or at least one layer of the coating further comprises using an optical emission monitor and/or a piezo crystal monitor to monitor formation of the coating or coating layer prior to determination of the target voltage level.

* * * * *